United States Patent [19]

Cline

[11] Patent Number: 4,618,797

[45] Date of Patent: Oct. 21, 1986

[54] ENVIRONMENTALLY SEALED PIEZOELECTRIC SENSING ASSEMBLY FOR ELECTRICAL SWITCH

[76] Inventor: David J. Cline, 9 Loma Ave., Long Beach, Calif. 90803

[21] Appl. No.: 685,997

[22] Filed: Dec. 24, 1984

[51] Int. Cl.[4] ............................................. H01L 41/08
[52] U.S. Cl. .................................... 310/339; 310/330; 200/181; 340/365 A
[58] Field of Search ................. 310/338, 339, 330-332, 310/322, 324; 200/181; 340/365 A

[56] References Cited

U.S. PATENT DOCUMENTS

| | | | |
|---|---|---|---|
| 2,587,304 | 2/1952 | Fiske, Jr. et al. | 310/338 |
| 3,239,696 | 3/1966 | Burkhalter et al. | 310/338 X |
| 3,307,052 | 2/1967 | Neilson et al. | 310/338 |
| 3,387,149 | 6/1968 | Young | 310/330 |
| 3,564,303 | 2/1971 | Geil | 310/330 X |
| 3,763,464 | 10/1973 | Laurent | 310/338 X |
| 3,935,485 | 1/1976 | Yoshida et al. | 310/339 |
| 4,190,785 | 2/1980 | Kompanek | 310/338 X |

Primary Examiner—Mark O. Budd
Attorney, Agent, or Firm—Fulwider, Patton, Rieber, Lee & Utecht

[57] ABSTRACT

An environmentally sealed sensing assembly for an electrical switch for use in adverse conditions such as a warm and humid location. The sensing assembly comprises a piezoelectric element carried by a relatively thin, flexible member supported at its edges within a recess formed in an enclosure. The enclosure includes a cavity in communication with the recess through a flow passage. A resiliently deformable encapsulating or potting material fills the recess, cavity, flow passage and any voids adjacent the piezoelectric element and the flexible member. Flexure of the flexible member through manual pressure or the like, to deform the piezoelectric element, is permitted by resilient deformation or "flow" of the potting compound. The potting material thus provides sealing while yet allowing mechanical movement of the flexible member and associated piezoelectric element. The resulting electrical signal caused by deformation of the piezoelectric element can be conditioned and used for switching electrical devices.

17 Claims, 3 Drawing Figures

ENVIRONMENTALLY SEALED PIEZOELECTRIC SENSING ASSEMBLY FOR ELECTRICAL SWITCH

BACKGROUND OF THE INVENTION

1. Field of the Invention

The present invention relates generally to a sensing assembly for an electrical switch and more particularly to an environmentally sealed sensing assembly without mechanical contacts and encapsulated in potting compound whereby it is specially suited for use in a humid, corrosive environment.

2. Description of the Prior Art

Electronic components are vulnerable to corrosion damage, which is particularly likely to occur in a warm, humid environment or in the presence of corrosive vapors. It is possible to protect electronic components such as transistors or even entire circuit boards from such an environment by encapsulating them within a waterproof and vapor-proof potting material. Potting materials suitable for this purpose and techniques for employing them are known to the art.

However, most electric switches are not amenable to protection by potting. Unlike other electronic components, most switches have mechanical contacts and depend for operation upon freedom of motion of at least one component. It is extremely difficult to design such a mechanical switch to exclude moisture or vapors without cutting off the freedom of motion necessary for the switch to function. Hence, the benefits of using potting material to protect electronic components from hostile environments have not been available for the protection of electric switches having such mechanical contacts.

Various other methods of protecting switches from the environment are known to the art. Most involve enclosure of the switch in a waterproof housing and sealing the electrical path of the mechanical connection between the switch contacts and the exterior by means of rubber boots, O-rings, gaskets or the like. Although such arrangements can seal out all moisture, they are expensive, cumbersome, and prone to failure.

Heretofore, there has been no inexpensive and simple way to construct a switch capable of enduring constant exposure to a hostile environment. For example, the switches installed adjacent to a hot tub for controlling the hot tub lights or pump are particularly vulnerable to corrosion damage because the surrounding atmosphere is warm and humid. Methods known to the art have not been adequate to protect such switches from corrosion.

U.S. Pat. No. 4,268,713, issued to Donley et al on May 19, 1981, teaches an encapsulated waterproof flasher for motor vehicle lights. The flasher has a cavity for a component such as a relay having mechanical switch contacts, but without exterior mechanical connections. Potting material completely seals the cavity to protect the relay contacts from the external environment. The Donley apparatus is representative of those systems using potting material to protect switching contacts from a moist external environment, but it is not adapted to provide for the protection of switching contacts mechanically connected to the exterior.

There is a need for a switch sensing assembly usable in proximity to a hot tub, or other moist or corrosive environment, and capable of functioning without conventional mechanical switch contacts.

SUMMARY OF THE INVENTION

According to the present invention, there is provided a sensing assembly for a switch, and comprising a piezoelectric element carried by a flexible member. "Piezoelectric element" is used herein to denote any material which generates an electrical signal when deformed mechanically. The element and the supporting flexible member are sealed by a potting compound to protect them from the environment.

The flexible member rests at its edges upon a rigid support. When pressure is applied to the outer surface of the sensing assembly, or upon any overlying insulating material, the central portion of the piezoelectric element deforms downwardly, causing the piezoelectric element to generate an output voltage pulse. This output voltage pulse is directed by electrical conductors to suitable electronic circuitry which performs a filtering and shaping process to provide an accurate switch signal. The potting material is located within the rigid support and is sufficiently resilient that it permits deformation of the assembly under such pressure, and a subsequent return to its undeformed state when pressure is released. The potting material also seals off the electrical conductors coupled to the opposite faces of the piezoelectric element.

The potting material is a moisture resistant gel that elastically deforms or "flows" slightly under pressure, returning to its original position upon release of such pressure.

In one embodiment, the flexible member is a relatively thin sheet of metal such as copper, and the piezoelectric element is affixed to the copper member with epoxy adhesive. The epoxy layer is sufficiently thin that it is electrically "transparent" and a conductive path exists between the bottom surface of the element and the flexible supporting member. In this embodiment, one wire is attached to the copper member and another wire is attached to the upper surface of the crystal element. In addition, the flexible member is prevented from moving too far by integral stop means, such as the base of the cavity within which the flexible member is disposed.

In another embodiment, the circuit to amplify the voltage output of the crystal element is also enclosed within the adjacent potting material.

It will be appreciated from the foregoing that the present invention represents a significant advance in the field of switches, and, in particular, in switches for use in harsh environments. There are no switch contacts to corrode or wear out, and the active switching elements of the sensing assembly are completely enclosed in potting compound and hence are impervious to moisture or other potentially damaging materials in the environment.

Other aspects and advantages of the present invention will become apparent from the following more detailed description taken in conjunction with the accompanying drawings.

DESCRIPTION OF THE PREFERRED EMBODIMENT

As previously indicated, there has heretofore not been a feasible way to protect a mechanically movable switch contact from the corrosive effects of an adverse environment, such as the warm and humid air found in the vicinity of a hot tub, especially in applications where the switch is constantly exposed to the hostile environment. The present invention solves this problem by providing a sensing assembly which comprises a piezoelectric crystal element protected by a potting compound that permits enough flexure of the piezoelectric element to generate a switching output signal in response to external mechanical pressure by an operator or the like. There are no mechanical contacts.

Figure 1:
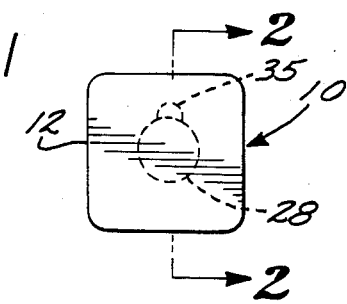
FIG. 1 is a top plan view of an electrical switch incorporating a sensing assembly according to the present invention.
Figure 2:
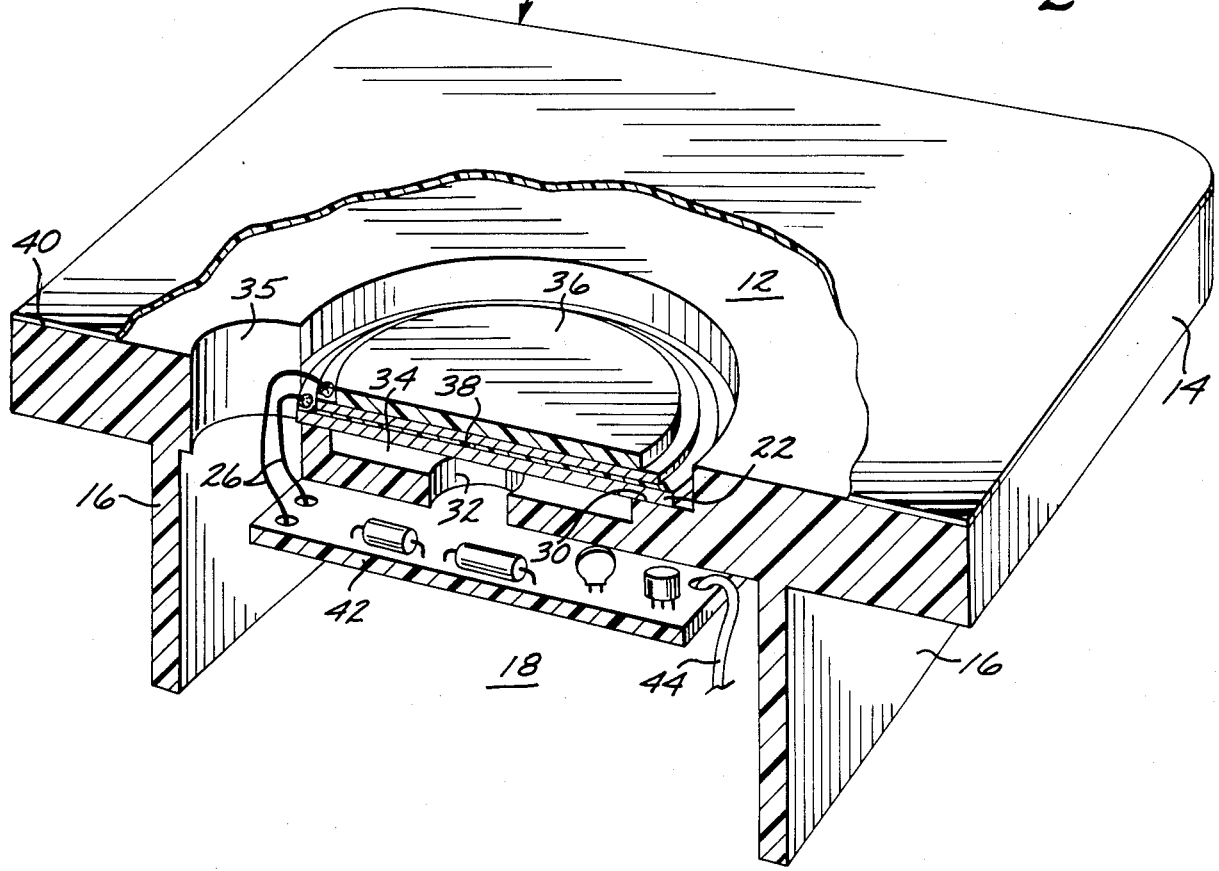
FIG. 2 is a perspective view of the switch of FIG. 1, viewed from the line 2—2 of FIG. 1, but without potting material in place.
Figure 3:
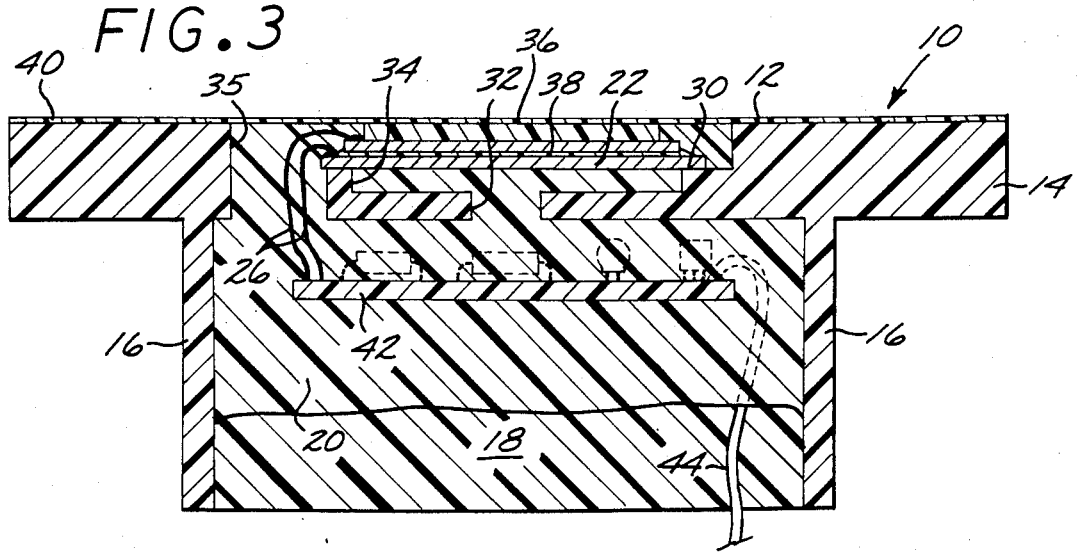
FIG. 3 is a cross section taken along the line 2—2 of FIG. 1 illustrating the potting material filling the voids.

More particularly, FIG. 1 illustrates the general form of electrical switch incorporating the sensing assembly 10 according to the present invention. The sensing assembly 10 comprises, generally, a housing or enclosure 12 of box-like configuration having an open bottom. The enclosure 12 includes a horizontal wall 14 and four depending vertical walls, only the opposite side walls 16 being illustrated in FIGS. 2 and 3. These vertical walls and the horizontal wall 14 define a downwardly opening cavity 18 which, as will be seen, is filled with a potting material 20, as seen in FIG. 3.

The sensing assembly 10 further comprises a flexible, generally planar member 22, a generally planar sensor, transducer or piezoelectric element 24, preferably attached to the upper surface of the member 22, and electrical conductor means in the form of a pair of conductors 26 coupled to the opposite surfaces of the element 24 and extending into the cavity 18 for carrying signals generated upon deformation of the element 24. The term "sensor" is used to indicate that the piezoelectric element 24 "senses" an external pressure or force sufficient to bend or deform it by generating an electrical output pulse. The assembly 10 is termed a "sensing" assembly for the same reason, inasmuch as the piezoelectric element 24 is a part of the assembly 10.

The enclosure 12 is preferably made of an electrically insulating material such as an inelastic or rigid material of plastic composition. The upper or horizontal wall in one embodiment is approximately one-quarter inch thick and includes an exteriorly opening circular recess 28. The recess 28 actually comprises an upper opening of larger diameter and a lower opening of smaller diameter whereby the peripheral walls or edge margins of the recess 28 define an annular or circular shoulder, rim or ledge 30 upon which the outer edge of the member 22 rests.

A vertical opening or flow passage 32 extends through the base 34 of the recess 28, through the horizontal wall 14 and into the cavity 18. The recess base 34 is spaced slightly below the lower surface of the overlying member 22 to allow flexure of the member 22. However, the distance between the lower surface of the member 22 and the base 34 is very slight so that the member 22 can engage or "bottom" against the base 34 if too much force is exerted against the element 24. This prevents possible damage to the element 24.

A cylindrical conductor opening 35 also extends vertically through the enclosure wall 14, its upper portion opening into the recess 28 to receive the pair of conductors 26.

The planar member 22 is preferably made of thin sheet metal material which is electrically conductive. A copper sheet material approximately 0.05 millimeters thick has operated satisfactorily, but stainless steel or other metals are also quite suitable so long as they are electrically conductive and are characterized by the desired flexure or capability for resilient deformation. The diameter of the member 22 is selected such that its circumferential edge margins rest upon the ledge 30, the remainder of the member 22 spanning that portion of the recess 28 which underlies the member 22.

The piezoelectric element 24, like the supporting member 22, is circular in form, although any shape is satisfactory. In one suitable embodiment the element 24 is approximately 0.05 millimeters thick and about 17 millimeters in diameter. The element 24 is of slightly lesser diameter than the diameter of the underlying planar member 22.

Preferably an electrically insulating disk or spacer 36 is disposed on the upper surface of the element 24. Its thickness, in combination with the dimensions of the recess 28 and associated components, is selected such that the upper surface of the spacer 36 is approximately flush with the adjacent upper surface of the wall 14. With this arrangement the upper surface of the element 24 is located below the adjacent surface of the wall 14 to leave room for a conductor 26 to be attached to the top of the element 24.

The spacer 36 may or may not be adhesively secured to the element 24, but the element 24 is preferably adhesively secured to the underlying member 22 by a layer 38 of adhesive material such as an epoxy or the like. The layer 38 of epoxy is sufficiently thin that it is electrically "transparent", that is, it does not interfere with the electrical path between the element 24 and the copper member 22.

A protective layer 40 is preferably adhered to the upper surface of the enclosure wall 14 and to the spacer 36. The material of the layer 40 carries indicia (not shown) to indicate where pressure or force is to be applied by the user to actuate the sensing assembly 10. The layer 40 may be a polycarbonate material, such as that marketed under the trademark Mylar. Any suitable adhesive can be used to adhere the layer 40 in position, the layer 40 preferably being approximately 0.1 millimeter thick.

Using components having the dimensions described above has been found to enable a central deflection of the element 24 of approximately 0.02 millimeters, which is sufficient to generate an appropriate electrical signal. In this regard, the conductors 26 are illustrated as connected to electrical circuit means in the form of a circuit board 42 located within the enclosure cavity 18. However, the circuit board 42 is merely representative of any electrical circuitry which may be associated with the piezoelectric element 24. Typically it would be a circuit for amplifying the output voltage from the element 24. Where the sensing assembly 10 includes such a circuit the arrangement would constitute a switch for operating lights, pumps, or the like in a hot tub application, for example.

Although only one element 24 is illustrated, it will be apparent that the sensing assembly 10 of the present invention is adapted to function as a weatherproof control panel having multiple elements 24, each being associated with a circuit board 42 to form a switch for operating a different electrical device.

Selection of the proper potting material 20 is important to the present invention. The material 20 must be resistant to whatever hostile chemicals will be encountered in the operating environment, and it must be sufficiently elastic or resiliently deformable to permit deflection of the center of the member 22 and the associated element 24, and also return to its previous undeformed state once external pressure on the member 22 and element 24 is removed. A silicone dielectric gel, marketed by Dow Corning as Q3-6527A and B, has been found to give good results. It is a high dielectric substance and is totally hydrophobic, that is, water cannot penetrate it.

By proper selection of an appropriate dielectric potting material 20 and protective layer 40, the sensing assembly 10 and the circuit board 42 making up the complete switch can be made resistant to almost any chemical or other substance. For example, if the switch were to be operated in an acid atmosphere, a sheet of flexible acid-resistant material would be used for the layer 40 and acid-resistant material would be used for the potting material 20.

The potting material 20 is initially poured in a liquid state into cavity 18 with the enclosure 12 in an inverted state. This enables the potting material 20 to flow through the flow passage 32 and through the opening 35 to fill all portions of the recess 28 and also any spaces existing around the conductors 26 and between the various components underlying the protective layer 40. Pouring of the potting material 20 is continued until it fills that portion of the cavity 18 within which the circuit board 42 is disposed so that the board 42 is also completely encapsulated. Only electrical conductors 44 attached to the circuit board 42 extend out of the potting material 10 for connection to the external electrical equipment which is to be operated. Filling of all voids can be facilitated by placing the filled enclosure 12 in a vacuum chamber, with the potting material 20 in an as yet uncured state. A vacuum is developed to remove air, and subsequent backfilling or admission of air then drives the potting material into any voids that exist.

In operation, the sensing assembly 10 is actuable by manual depression of the thin layer 40 in the region overlying the spacer 26. Such operator pressure downwardly deflects the member 22 and the associated piezoelectric element 24. The adjacent potting material 20 is displaced by resilient deformation, or partial "flowing" out of the recess 28 underlying the member 22, through the flow passage 32, and into the cavity 18. The degree of deformation or flow is very small, but it is sufficient to permit the desired mechanical flexure of the member 22 and element 24.

Upon release of manual pressure upon member 22 and element 24, these components tend to return to their undeflected state by virtue of their own resilience, and aided by the elasticity or resilience of the potting material 20, which tends to flow back to its original location.

The present switch sensing assembly 10 represents a significant advance over the prior art in that, unlike prior art having mechanical switch contacts, the sensing assembly 10 is completely impervious to moisture or corrosive vapors even when the sensing assembly is constantly exposed to such vapors.

Although one specific embodiment of the invention has been described and illustrated, it will be understood that the invention is not to be limited to the specific forms or arrangements of parts so described and illustrated, and that various changes can be made within the scope of the appended claims.

I claim:

1. A sensing assembly for an electrical switch, said sensing assembly comprising:
   enclosure means defining a cavity and including support means defining a supporting ledge and a stop means;
   a flexible generally planar member resting at its edge portions upon said ledge in overlying, closely spaced relation to said stop means whereby said planar member is permitted flexure within the space between said planar member and said stop means, said stop means being engagable by said planar member to limit the degree of said flexure, and said space being in communication with said cavity;
   a generally planar piezoelectric element attached to one of the surfaces of said flexible member and characterized on deformation by generation of an electrical signal;
   electrical conductor means coupled to said piezoelectric element and extending into said cavity for carrying said signal; and
   resiliently deformable potting means filling said space and extending into said cavity to block entry of moisture into said space and said cavity, the resilient deformability of said potting means enabling flexure of said flexible member and said piezoelectric element for generating said signal.

2. A sensing assembly according to claim 1 wherein said piezoelectric element is attached to the exteriorly directed surface of said flexible member.

3. A sensing assembly according to claim 1 wherein said piezoelectric element is adhesively bonded to said exteriorly directed surface.

4. A sensing assembly according to claim 1 wherein said flexible member comprises a relatively thin element made of electrically conductive material bonded to said exteriorly directed surface by a thin, electrically transparent layer of adhesive material.

5. A sensing assembly according to claim 2 and including a layer of electrically insulating material located upon the exteriorly directed surfaces of said flexible member and said piezoelectric element.

6. A sensing assembly according to claim 1, and including electrical circuit means coupled to said electrical conductor means, and located in a portion of said cavity filled with said potting means.

7. A sensing assembly according to claim 1 wherein said support means comprises a wall having an opening affording said communication, and engagable by said flexible member for limiting said flexure.

8. A sensing assembly comprising:
   enclosure means defining a cavity and including a rigid wall having an exteriorly opening circular recess, the edge margins of said recess being formed to define a supporting ledge, said wall further having a flow passage providing communication between said recess and said cavity;
   a flexible generally planar member spanning said recess and resting at its edge portions upon said ledge;
   a generally planar piezoelectric element attached to one of the surfaces of said flexible member and characterized on deformation by generation of an electrical signal;
   electrical conductor means coupled to said piezoelectric element and extending into said cavity for carrying said signal;

adhesive means bonding said piezoelectric element to the exteriorly directed surface of said flexible member;

an electrically insulating member overlying the exteriorly directed surfaces of said piezoelectric element and said flexible member;

electrical circuit means in said cavity and coupled to said electrical conductor means; and resiliently deformable potting means filling said recess to block entry of moisture into said recess, and also filling said flow passage and the portion of said cavity surrounding said electrical circuit means, the resilient deformability of said potting means enabling flexure of said flexible member and said piezoelectric element, upon application of external pressure, through deformational flow of said potting means in said recess from said recess, through said flow passage and into said cavity, said flow of said potting means being oppositely directed upon removal of said external pressure.

9. A sensing assembly according to claim 8 wherein said potting means is a silicone dielectric gel.

10. An electrical switch according to claim 8 wherein said recess includes a base in spaced relation with said flexible member, and said flow passage extends through said base.

11. A sensing assembly according to claim 8 wherein said flexible member comprises a relatively thin element made of electrically conductive metal.

12. A sensing assembly according to claim 8 wherein said adhesive means comprises a layer of epoxy material sufficiently thin as to be electrically transparent.

13. A sensing assembly according to claim 8 wherein said electrical conductor means comprises a pair of electrical conductors coupled to opposite surfaces of said piezoelectric element.

14. A sensing assembly according to claim 9 wherein said rigid wall of said enclosure means includes an opening adjacent said recess and extending into said cavity, and said electrical conductors extend from said recess, through said opening and into said cavity, and wherein said potting means fills said opening to surround said electrical conductors.

15. A sensing assembly according to claim 8 and including an electrically insulating spacer overlying said flexible member and said piezoelectric element, and generally flush with the exteriorly directed surface of said rigid wall of said enclosure.

16. A sensing assembly according to claim 8 wherein said recess includes a base engageable by said flexible member for limiting the degree of deformation of said piezoelectric element.

17. Hot tub electrical switch means for operating electrically operated apparatus, and including a sensing assembly comprising:

enclosure means defining a cavity and including support means defining a support ledge and a stop means;

a flexible generally planar member resting at its edge portions upon said ledge in overlying, closely spaced relation to said stop means whereby said planar member is permitted flexure within the space between said planar member and said stop means, said stop means being engagable by said planar member to limit the degree of said flexure, and said space being in communication with said cavity;

a generally planar piezoelectric element attached to one of the surfaces of said flexible member and characterized on deformation by generation of an electrical signal;

electrical conductor means coupled to said piezoelectric element and extending into said cavity for carrying said signal;

resiliently deformable potting means filling said space and extending into said cavity to block entry of moisture into said space and said cavity, the resilient deformability of said potting means enabling flexure of said flexible member and said piezoelectric element for generating said signal; and electrical circuit means coupled to said electrical conductor means and located in a portion of said cavity filled with said potting means, said circuit means being adapted for connection to pump apparatus for operating said pump appartus responsive to said generation of said electrical signal.

* * * * *